United States Patent [19]

Kiemle

[11] 3,985,439
[45] Oct. 12, 1976

[54] DEVICE FOR THE LIGHT-OPTICAL, COMPUTER-CONTROLLED DRAWING OF MASKS FOR SEMICONDUCTOR COMPONENTS

[75] Inventor: Horst Kiemle, Neuried, Germany
[73] Assignee: Siemens Aktiengesellschaft, Berlin & Munich, Germany
[22] Filed: Aug. 15, 1975
[21] Appl. No.: 605,190

[30] Foreign Application Priority Data
Aug. 29, 1974 Germany............................ 2441472

[52] U.S. Cl. .............................. 355/46; 346/76 L; 354/4; 354/118; 355/2
[51] Int. Cl.² ........................................ G03B 27/44
[58] Field of Search ............... 355/2, 18, 46, 67, 77, 355/133; 354/4, 118; 346/76 L

[56] References Cited
UNITED STATES PATENTS

| | | | |
|---|---|---|---|
| 3,295,409 | 1/1967 | Debrie ................................ | 355/46 |
| 3,545,854 | 12/1970 | Olsson ................................ | 355/46 |
| 3,584,948 | 6/1971 | Herriott ............................. | 355/77 |
| 3,609,027 | 9/1971 | Lowenthal ......................... | 355/46 X |
| 3,656,849 | 4/1972 | Lu........................................ | 355/46 |
| 3,791,275 | 2/1974 | Bryngdahl......................... | 355/46 X |

Primary Examiner—R. L. Moses
Attorney, Agent, or Firm—Hill, Gross, Simpson, Van Santen, Steadman, Chiara & Simpson

[57] ABSTRACT

A device for electro-optically, computer-controlled drawing of a plurality of mask patterns in a layer of light sensitive material disposed on a plane of a mask carrier characterized by a source of coherent light, a modulator for modulating the coherent light, a light detector for imposing a row-by-row scanning motion on the beam of light, an objective device for projecting the beam onto a layer of the light sensitive material, optical lenses arranged between the light deflector and the objective device for imaging the output plane of the light deflector onto a plane of the objective which includes an objective lens arrangement for focusing the beam and a multiplier hologram for splitting up the focused beam emerging from the objective lens arrangement into a plurality of identical subbeams directed in different directions so that the plurality of spaced identical mask patterns are simultaneously formed in a light sensitive layer. Preferably, the device includes an immersion means such as a glass body which is disposed between the objective device and the plane of the mask carrier.

4 Claims, 2 Drawing Figures

DEVICE FOR THE LIGHT-OPTICAL, COMPUTER-CONTROLLED DRAWING OF MASKS FOR SEMICONDUCTOR COMPONENTS

BACKGROUND OF THE INVENTION

The present invention relates to a device for a light-optical, computer-controlled drawing of masks for semiconductor components which device consists of a coherent light source, electrically controllable light modulator, a light deflector and a projection objective.

The trend in modern semiconductor components, in particular for the application of data processing fields, is towards an increasingly larger, monolithically integrated circuit complexes for increasingly more specialized functions. This trend necessitates increasing number of different types of circuit designs with a correspondingly reduction in number of each particular type which are required. Thus, the increase of different types of circuits with a decrease of number of each type, increases the number of different masks which are required and thus involves increased cost in the production of all types of the different circuit complexes being used.

The previous mask production processes consist in forming a mask by producing a precision drawing of the mask pattern on a greatly enlarged scale which drawing was produced with the aid of a computer-controlled precision drawing machine. After producing the drawing on a greatly enlarged scale of the desired mask pattern, a plurality of optical reducing steps were utilized to reduce the size of the mask to the desired scale and to mechanically multiply the number of masks which are to be placed on a mask carrier which is subsequently used in the production of semiconductor components. This process is very time consuming and expensive.

A possibility of drawing a masked pattern of the desired scale directly on a mask carrier consists in using an electron beam. However, this process involves several disadvantages such as the electronic beam must be operated in a high vacuum. The process also requires a displacement and precise adjustment of the mask carrier after each step-by-step tracing of the pattern thereon.

SUMMARY OF THE INVENTION

The present invention is directed to providing a device for the light-optical, computer-controlled drawing of masks with which the mask can be drawn rapidly and simply in the original scale without the use of high vacuum and without requiring a displacement and precise adjustments of the mask carrier after each pattern is drawn.

To obtain these goals, the device of the present invention comprises a source for producing a beam of coherent light, electrically controllable modulator means for receiving the beam of coherent light and modulating the beam in response to a signal, a light deflector means for receiving the modulated beam of coherent light and for deflecting the modulated beam in a row-by-row scanning motion in response to a deflection signal, said deflector means having an output plane, objective means for projecting a beam onto a layer of light sensitive material on the mask carrier, beam guidance means arranged between the light deflecting means and the objective means. The beam guidance means has optical lenses for focusing the plane of the light deflector means onto a plane of the objective means. The objective means includes an objective lens arrangement for focusing the beam and a multiplier hologram disposed at the rear of the objective lens arrangement with the multiplier holograms splitting up the focused beam emerging from the objective lens into a plurality of identical sub-beams directed in different directions so that a plurality of spaced, identical mask patterns are simultaneously formed in the light sensitive layer on the mask carrier as the coherent light beam is moved in a row-by-row scanning motion by the deflector means.

Preferably, immersion means is arranged between the objective means and the mask plane which is the layer of light sensitive material disposed on a plane of the mask carrier.

DESCRIPTION OF THE PREFERRED EMBODIMENT

Figure 1:
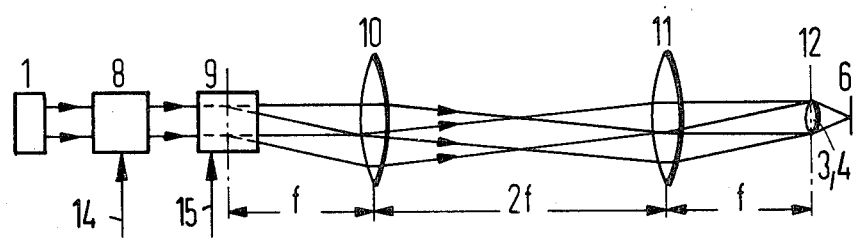
FIG. 1 is a schematic illustration of a device in accordance with the present invention.

The principles of the present invention are particularly useful when incorporated in a device for light-optical, computer-controlled drawing of a plurality of mask patterns and which device is schematically illustrated in FIG. 1.

Figure 2:
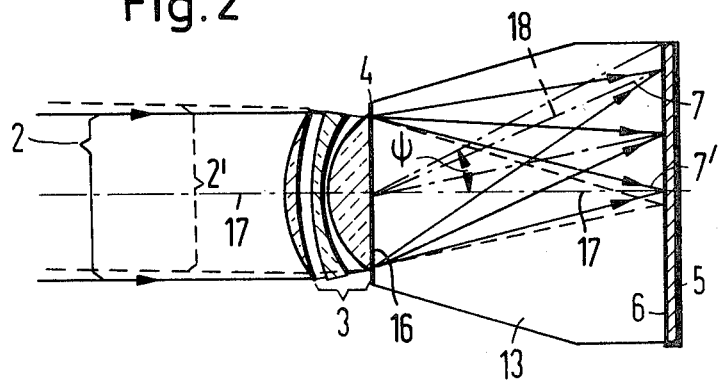
FIG. 2 illustrates the beam path from the objective means to the mask plane.

The device of FIG. 1 has a source of coherent light 1, such as a laser, which produces a beam of coherent light which is directed to an electrically controllable light modulator 8. The modulator 8 modulates the light intensity in response to an input signal indicated by arrow 14 which signal can be produced by a computer. From the modulator 8, the modulated beam is received in a light deflector means 9. The deflector means 9 will deflect the modulated beam in two dimensions or directions in response to a deflection signal 15 and produce a row-by-row scanning motion. The deflection beam is received by a beam guidance means which is illustrated as two lenses 10 and 11 and which guide the deflected beam to objective means 12. As best illustrated in FIG. 2, the objective means 12 includes an objective lens arrangement 3 and a multiplier hologram 4 and projects a modulated and deflected beam 2 onto a light sensitive layer 6 which is carried on a plane of a mask carrier 5. Preferably immersion means, such as a glass body 13, is positioned between the hologram 4 and the layer 6. The hologram 4 may be formed in a layer on a surface 16 of the body 13.

The laser 1 supplies a requisite coherent radiation and the light modulator 8 controls the light amplitude in accordance with the input electrical signals which may be received from a computer. The light deflector 9 ensures that the required image field is scanned row-by-row by a light spot in the plane of the layer 6. The beam guidance means which consist of two collective lenses 10 and 11 each having a focal length $f$. The first lens 10 is arranged at the distance $f$ from the optical center of the light deflector 9 and the second collective lens 11 is arranged at a distance $2f$ from the first collective lens 10 and a distance $f$ from the optical center of the objective means 12 so that the entire output plane of light of the light deflector 9 is focused into the entrance pupil of an objective lens arrangement 3 of the objective means 12. As a result of this measure, for every beam direction, for example, every possible position in the row-by-row scan, the objective lens arrangement 3 is fully illuminated and thus the highest possible resolution is achieved over the entire image field.

The angle of incidence on the pupil or light plane of the objective lens arrangement 3 of the modulated and deflected beam 2 of coherent light is controlled by the light deflector 9. The light beam is focused through the objective lens arrangement to form a diffraction limited sharp focal spot in the plane of the layer 6, which is a mask plane, with the position of the focal spot in the mask being determined by the axial position of the incident beam 2. The solid lines of beam 2 show a first axial direction with respect to the optical axis 17 and the broken lines of beam 2' show an adjacent axial direction to the axis 17. The multiplier hologram 4, which is known per se, is arranged in the exit plane of the objective lens arrangement 3. This hologram is an optical element which has the property of converting an incident light beam into a plurality of beams 7, 7', which are of equal intensity but possesses different, arbitrarily selectable directions, as illustrated in FIG. 2. In the arrangement in accordance with the present invention, this multiplier hologram 4 fulfills the function of multiplying the image field made available by the objective lens arrangement 3. Therefore, in order to draw a complete mask in the mask plane of the layer 6 on the mask carrier 5, which mask has numerous identical images or patterns with one pattern or image for each circuit, it is sufficient to use an image field which can be handled by a known objective lens arrangement. However, objective lense arrangements or objective means, which would simultaneously project all of the circuit images with an adequate resolution, are not known.

With an increasing angle $\psi$ of the axis 18 of the subbeams 7 which are diffracted by the multiplier hologram 4 in relation to the optical axis 17, the convergence angle of each sub-beam 7 is reduced so that the mask plane 6 is increasingly more obliquely intersected by the axis 18 of the sub-beams 7. With an increasing distance of the point of intersection from the optical axis 17, the focal spot of the sub-beam 7 has an increasing dimension; therefore, the multiplication by the hologram 4 of the number of mask images, which are to be drawn, is subject to certain limits. If one allows the resolution to be halved at the edge of the entire mask in comparison to the resolution at the center, an angle of diffraction $\psi \sim 30°$ is permissible. Consequently, the distance between the mask plane of the layer 6 and the objective lens arrangement 3 is to be approximately equal to the diameter of the total mask being formed on the carrier 5. If the coherent light has a wavelength of 488 nm, which wavelength can be easily produced by a laser with a good power yield, if immersion means, for example a glass body 13 having an index of refraction of $n = 2$ is inserted between the objective lens arrangement 3 and the mask carrier 5, and if the objective lens arrangement 3 is used whose diameter amounts to half the diameter of the entire mask being formed, a resolution which is better than or equal to 1 $\mu$m is obtained over the entire mask surface.

The photo-resist technique is particularly suitable for producing a multiple hologram 4. It ensures an optically perfect function with the greatest possible image brightness. The photo-resist may be applied on the surface 16 of body 13 and then the hologram 4 exposed and developed.

In the interest of a favorable design of the multiplier hologram 4, it is expedient not to use the undiffracted light component or sub-beam which is identified as 7'. This is because it is not possible to freely dimension its brightness in comparison to the intensity of the diffracted sub-beams 7. This means that the single circuit, which will be formed in the area where the undiffracted beam 7 is projected, will possibly break down and contain faults. However, the loss of this one pattern in the entire mask can be tolerated.

By means of the device of the present invention, it is thus possible to use a known objective lens arrangement, which is capable of drawing a single circuit mask pattern with adequate resolution to now simultaneously draw a plurality of spaced identical mask patterns which are arranged on the entire mask surface and which have the desired original scale. By simultaneously drawing all of the mask patterns in a single operation, the time required for the development, production, and preparation of a mask for a given type of circuit can be substantially reduced.

Although various minor modifications may be suggested by those versed in the art, it should be understood that I wish to employ within the scope of the patent granted hereon, all such modifications as reasonably and properly come within the scope of my contribution to the art.

I claim:

1. In a device for light-optical, computer-controlled drawing of masks for semiconductor components, said device comprising a source providing a coherent light beam, an electrically controllable light modulator means for modulating the beam of coherent light, a light deflector means having a plane for deflecting the beam of modulated coherent light and objective means including an objective lens arrangement for projecting the modulated beam of coherent light onto a layer of light sensitive material disposed on a plane of a carrier to form the mask pattern therein, the improvements comprising the projection means including a multiplier hologram disposed at the rear of the objective lens arrangement, said multiplier hologram splitting the focused light beam emerging from the objective lens arrangement into a plurality of sub-beams which are identical and extend in different directions, and additional optical lenses which are arranged between the light deflector means and objective means, said additional lenses focusing the plane of the light deflector means onto a plane of the objective means.

2. A device according to claim 1, wherein an immersion means is disposed between the objective means and the plane of the carrier.

3. A device for the light-optical, computer-controlled drawing of a plurality of masks in a layer of light sensitive material disposed on a plane of a mask carrier to produce a plurality of spaced, identical mask patterns thereon for use in producing semiconductor components comprising a source for producing a beam of coherent light; an electrically controllable modulator means for receiving the beam of coherent light and modulating the beam in response to a signal; a light deflector means for receiving the modulated beam of coherent light and for deflecting the modulated beam in a row-by-row scanning motion in response to a deflection signal, said deflector means having a plane; objective means for projecting the beam onto the layer of light sensitive material on the mask carrier, and beam guidance means arranged between the light deflector means and the objective means, said beam guidance means having optical lenses for focusing the plane of the light deflector means onto a plane of the objective means, said objective means including an objective lens arrangement for focusing the beam and a multiplier hologram disposed at the rear of the objective lens arrangement, said multiplier hologram splitting up the focused beam emerging from the objective lens arrangement into a plurality of identical sub-beams directed in different directions so that a plurality of spaced, identical mask patterns are simultaneously formed in the light sensitive layer on the mask carrier as the coherent light beam is moved in a row-by-row scanning motion.

4. A device according to claim 3, wherein immersion means is disposed between the objective means and the layer on the mask carrier.

* * * * *